US009425812B2

(12) United States Patent
Hwang et al.

(10) Patent No.: US 9,425,812 B2
(45) Date of Patent: Aug. 23, 2016

(54) CIRCUIT CALIBRATING METHOD AND CIRCUIT CALIBRATING SYSTEM

(71) Applicant: PixArt Imaging Inc., Hsin-Chu (TW)

(72) Inventors: Hsiang-Wei Hwang, Hsin-Chu (TW); Yung-Hung Chen, Hsin-Chu (TW); Han-Chi Liu, Hsin-Chu (TW)

(73) Assignee: PixArt Imaging Inc., Hsin-Chu (TW)

(*) Notice: Subject to any disclaimer, the term of this patent is extended or adjusted under 35 U.S.C. 154(b) by 0 days.

(21) Appl. No.: 14/753,036

(22) Filed: Jun. 29, 2015

(65) Prior Publication Data

US 2016/0173116 A1    Jun. 16, 2016

(30) Foreign Application Priority Data

Dec. 16, 2014   (TW) .............................. 103143923 A

(51) Int. Cl.
*H03M 1/10*  (2006.01)
*H03M 1/12*  (2006.01)

(52) U.S. Cl.
CPC .............. *H03M 1/1028* (2013.01); *H03M 1/12* (2013.01)

(58) Field of Classification Search
CPC ........... H03M 1/06; H03M 1/10; H03M 1/12; H03M 1/121; H03M 1/1215; H03M 1/1245; H03M 1/1057; H03M 1/1004
USPC ................... 341/118–155; 375/345
See application file for complete search history.

(56) References Cited

U.S. PATENT DOCUMENTS

| | | | | |
|---|---|---|---|---|
| 4,962,380 | A * | 10/1990 | Meadows ............ | H03M 1/1009 341/120 |
| 5,955,980 | A * | 9/1999 | Hanna ................. | H03M 1/1057 341/120 |
| 7,812,746 | B2 | 10/2010 | Le | |
| 8,390,486 | B2 * | 3/2013 | Wang .................... | H04N 5/365 341/118 |
| 2008/0198784 | A1 | 8/2008 | Huang | |
| 2013/0106632 | A1 * | 5/2013 | Petigny ............... | H03M 1/1004 341/120 |
| 2013/0278303 | A1 | 10/2013 | Chen | |
| 2016/0006447 | A1 * | 1/2016 | Sundblad ............ | H03M 1/1004 341/159 |

FOREIGN PATENT DOCUMENTS

TW    200835151    8/2008

* cited by examiner

*Primary Examiner* — Lam T Mai
(74) *Attorney, Agent, or Firm* — Winston Hsu; Scott Margo

(57) ABSTRACT

A circuit calibrating method, applied to an ACS generating circuit, which comprises a plurality of ACS generating units and activates the ACS generating unit corresponding to different DCCs to generate difference ACSs. The circuit calibrating method comprises: (a) determining which one of the ACSs has a large difference from an ideal value thereof; (b) adjusting a number of the ACS generating units, which are activated by a DCC corresponding to the ACS acquired in the step (a), or a next stage of the DCC corresponding to the ACS acquired in the step (a); and (c) generating the ACS to a target circuit, according to the number of the ACS generating circuits adjusted in the step (b).

7 Claims, 11 Drawing Sheets

CIRCUIT CALIBRATING METHOD AND CIRCUIT CALIBRATING SYSTEM

BACKGROUND OF THE INVENTION

1. Field of the Invention

The present invention relates to a circuit calibrating method and a circuit calibrating system, and particularly relates to a circuit calibrating method and a circuit calibrating system which can control the number of active analog control signal generating units to reduce signal drift.

2. Description of the Prior Art

Some drift may occur during the manufacturing process for a circuit, such that all characteristics (ex. current, voltage, capacitance, and resistance) may have undesired values. Accordingly, a calibrating mechanism is needed.

FIG. 1 is a block diagram illustrating the prior art circuit calibrating system. As shown in FIG. 1, the circuit calibrating system 100 comprises a digital control code generating circuit 101 (hereinafter, a DCC generating circuit) and an analog control signal generating circuit 103 (hereinafter, an ACS generating circuit). The DCC generating circuit 101 is applied to generate a digital control code DCC such as 001, 010, 0110 . . . . The ACS generating circuit 103 comprises a plurality of analog control signal generating units (hereinafter, ACS generating units) U1, U2 . . . Un. The ACS generating units U1, U2 . . . Un can be some kinds of circuits, which comprise at least one transistor, and a capacitor. At least one of the ACS generating units U1, U2 . . . Un is activated corresponding to the digital control code DCC. The activated ACS generating units U1, U2 . . . Un provides analog control signals ACS to a target circuit 105 (i.e. the above mentioned circuit which needs to be calibrated). The target circuit 105 generates an output signal OS according to analog control signals ACS. The DCC generating circuit 101 receives the output signal OS and determines if the output signal OS has a desired value. If yes, recording the digital control code DCC being applied, such that it can be known that which control signal the target circuit 105 needs to generate the desired value. Or, the digital control code DCC is consecutively changed, until the output signal OS has the desired value.

FIG. 2 is a schematic diagram illustrating the ACS generating unit is activated by a digital control code, in prior art. Please note, for the convenience of understanding, the symbol of the ACS generating units correspond to a binary value. Take FIG. 2 for example, the first bit of the digital control code 001 is 1, such that the ACS generating unit with a symbol U1 is activated. In another example, the second bit of the digital control code 010 is 1, and the binary value thereof is 2, such that the ACS generating unit with a symbol U2 is activated. Following such rule, the first bit and the second bit of the digital control code 011 are 1, thus the ACS generating unit with symbols U1 and U2 are activated.

In this embodiment, the digital control code is a 3 bit code, and the ACS generating circuit comprises 7 ACS generating units with an ACS generating unit U1, 2 ACS generating units U2, and 4 ACS generating units U4. As depicted in FIG. 2, no ACS generating units are activated if the digital control code is 000. Also, if the digital control code is 001, only one corresponding ACS generating unit U1 is activated. If the digital control code is 010, two corresponding ACS generating units U2 are activated. If the digital control code is 011, corresponding ACS generating units U1, U2 are activated. If the digital control code is 100, 4 corresponding ACS generating units U4 are activated. In view of above-mentioned examples, the number for the activated ACS generating units is a binary code for the digital control code. However, such control method may cause larger signal drift.

For more detail, each ACS generating unit may have a signal draft amount which has a signal drift with a standard deviation $\delta_{cell}$, thus the signal drift is more serious if more differently activated ACS generating units are activated for each time. For example, if the ACS signal generating units are respectively activated by the digital control code 011 and 010, only one differently activated ACS generating unit U1 exists, thus the analog control signals ACS generated due to the digital control code 011 and 010 may exist a signal draft amount which has a signal drift with a standard deviation $\delta_{cell}$. Following the same rule, if the ACS signal generating units are respectively activated by the digital control code 001 and 010, three differently activated ACS generating units U1, U2 exist, thus the analog control signals ACS generated due to the digital control code 001 and 010 may exist a signal draft amount which has a signal drift with a standard deviation $\sqrt{3}\delta_{cell}$. Following the same rule, if the ACS signal generating units are respectively activated by the digital control code 011 and 100, seven differently activated ACS generating units exist (all U1, U2 and U4), thus the analog control signals ACS generated due to the digital control code 011 and 100 may exist a signal draft amount which has an signal drift with a standard deviation $\sqrt{7}\delta_{cell}$.

FIG. 3 is a schematic diagram illustrating a difference between the ideal output and the actual output for the ACS generating circuit, in prior art. As depicted in FIG. 3, some error may exist between the ideal output of the ACS generating circuit (i.e. the analog control signal ACS) and the actual output of the ACS generating circuit. However, such error may suddenly raises up for a specific stage of digital control code. The reason has been described in above-mentioned description, many different ACS generating units are activated for the specific stage of digital control code and a neighboring stage of digital control code for the specific stage of digital control code (ex. 011 and 100).

FIG. 4 is a schematic diagram illustrating how to activate the ACS generating unit via the digital control code and the decoder, in prior art. As depicted in FIG. 4, different stages of digital control codes activate ACS generating units in sequence, that is, the activated ACS generating unit does not correspond to particular bits. In such case, the number of differently activated ACS generating units for the digital control codes 011 and 010 can be reduced to 1. However, such method needs a decoder, which always occupies a large region of the circuit, to convert the original digital control codes to control codes which can activate ACS generating units in sequence.

SUMMARY OF THE INVENTION

Accordingly, one objective of the present application is to provide a circuit calibrating method that can reduce signal drift and increase a tolerance range.

Another objective of the present application is to provide a circuit calibrating system that can reduce signal drift and increase a tolerance range.

One embodiment of the present invention discloses a circuit calibrating method, for calibrating a target circuit, applied to an analog control signal generating circuit comprising a plurality of analog control signal generating units, wherein the analog control signal generating circuit correspondingly activates at least one part of the analog control signal generating units to generate different analog control signals according to different digital control codes. The circuit calibrating method comprises: (a) determining which one of the analog control signals has a large difference between an actual value of the analog control signal and an ideal value of the analog control signal; (b) adjusting a number of the analog control signal generating units that a digital control code corresponding to the analog control signal acquired in the step (a) can activate, or adjusting a number of the analog control signal generating units that a neighboring stage for the digital control code corresponding to the analog control signal acquired in the step (a) can activate; and (c)generating the analog control signal to the target circuit, according to the number of the analog control signal generating units, which is adjusted in the step (b).

Another embodiment of the present application discloses a circuit calibrating system applied to calibrate a target circuit. The circuit calibrating system comprises: a digital control code generating circuit, configured to generate a digital control code; an analog control signal generating circuit, comprising a plurality of analog control signal generating units, configured to correspondingly activate at least one part of the analog control signal generating units to generate different analog control signals according to different digital control codes; a control unit, configured to perform following steps (a)-(c): (a) determining which one of the analog control signals has a large difference between an actual value of the analog control signal and an ideal value of the analog control signal; (b) adjusting a number of the analog control signal generating units that a digital control code corresponding to the analog control signal acquired in the step (a) can activate, or adjusting a number of the analog control signal generating units that a neighboring stage for the digital control code corresponding to the analog control signal acquired in the step (a) can activate; and (c) generating the analog control signal to the target circuit, according to the number of the analog control signal generating units, which is adjusted in the step (b).

In view of above-mentioned embodiments, the signal drift for the analog control signal can be effectively reduced, to avoid that the signal drift is over a tolerance range. Please note, besides the advantage of decreasing the signal drift, the present invention can further provide an advantage of "increasing the tolerance range for the signal drift.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
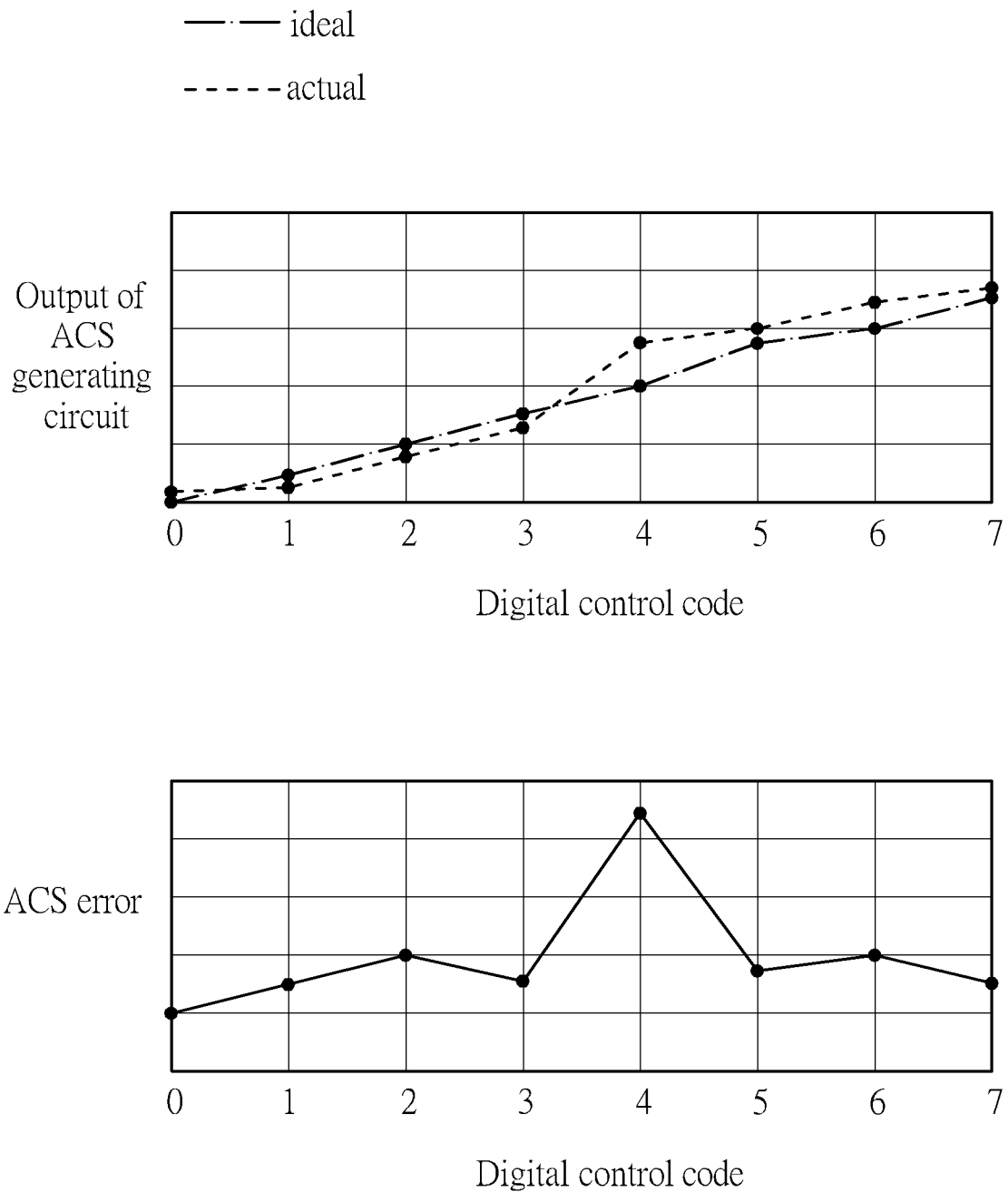
FIG. 3 is a schematic diagram illustrating a difference between the ideal output and the actual output for the ACS generating circuit, in prior art.
Figure 4:
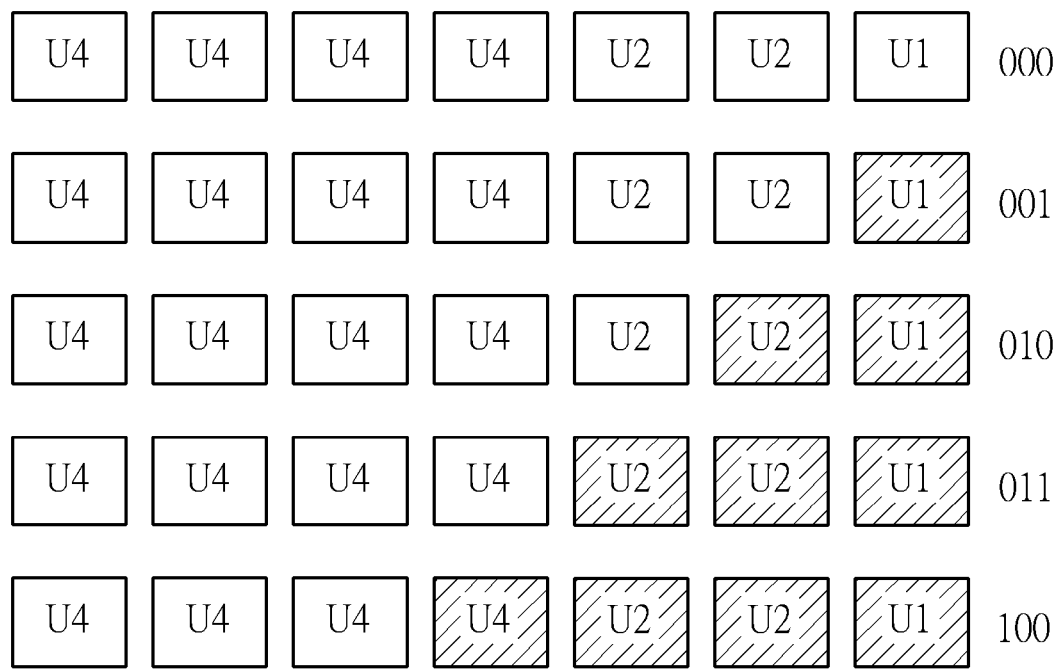
FIG. 4 is a schematic diagram illustrating how to activate the ACS generating unit via the digital control code and the decoder, in prior art.
Figure 5:
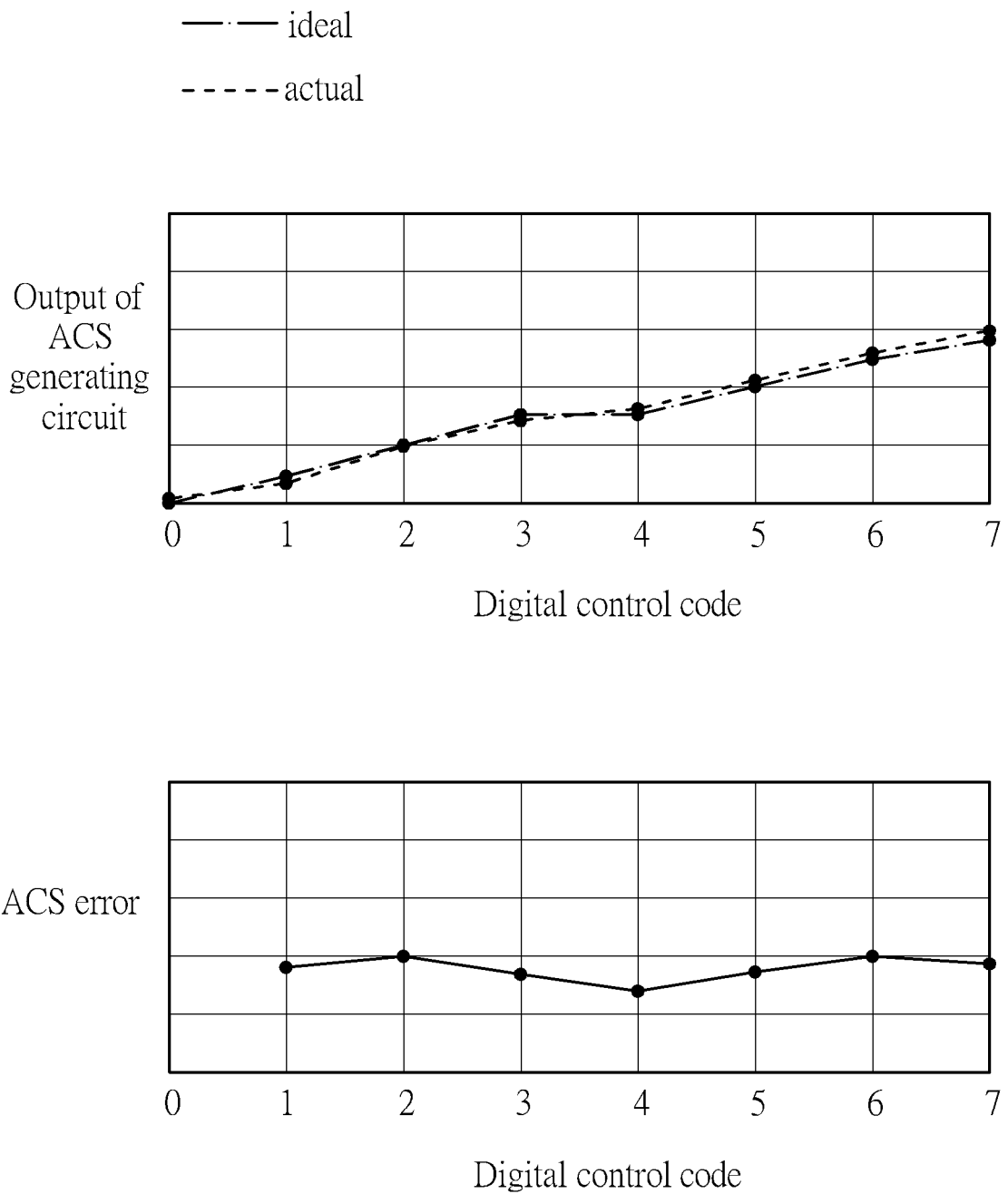
FIG. 5 is a schematic diagram illustrating a difference between the ideal output and the actual output for the ACS generating circuit, in one embodiment of the present invention.

Some embodiments are provided in following descriptions to solve the issue for prior art: A specific stage of digital control code or some stages of digital control codes make corresponding analog control signal(s) generates larger signal drift. FIG. 5 is a schematic diagram illustrating a difference between the ideal output and the actual output for the ACS generating circuit, in one embodiment of the present invention. Please note, the embodiment in FIG. 5 applies the example in FIG. 3 for explaining, but it does not mean the scope of the present invention is limited to FIG. 3. In FIG. 3, the fourth stage of digital control code makes the ACS generating circuit have a larger signal drift. Accordingly, in the embodiment of FIG. 5, ACS generating units activated by the fourth stage of digital control code are adjusted. That is, adjust the ideal output of the ACS generating circuit if the fourth stage of digital control code is applied. By this way, a difference between the ideal output and the actual output of the ACS generating circuit while applying the fourth stage of digital control code is reduced, thus the above-mentioned issues can be solved. However, since the reason for the fourth stage of digital control code causes the difference between the ideal output and the actual output of the ACS generating circuit larger is that a number for differently activated ACS generating units between the third stage and the fourth stage of digital control codes is large, the ACS generating units activated by the third stage of digital control code can be adjusted as well as the ACS generating units activated by the fourth stage of digital control code.

Figure 1:
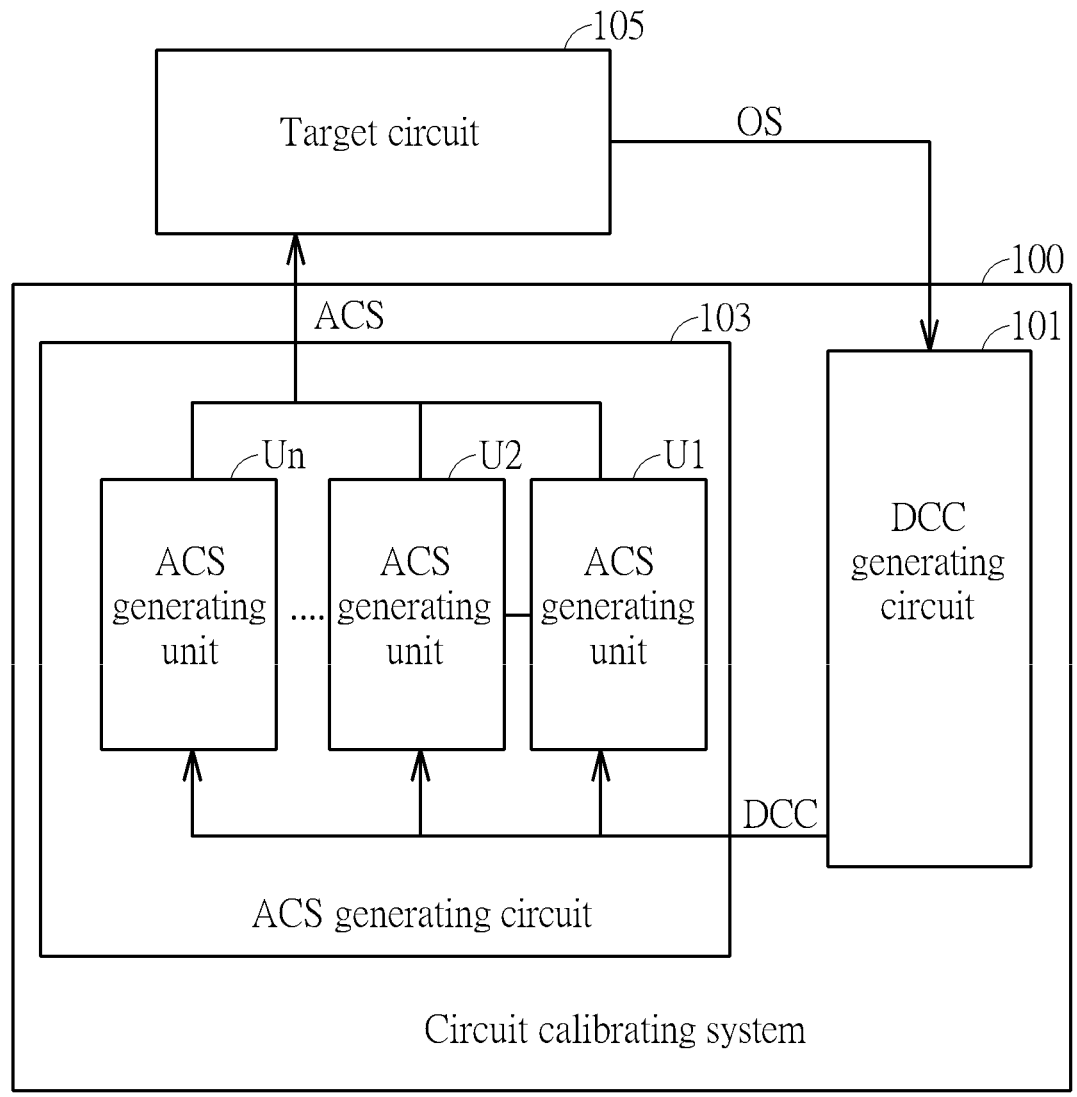
FIG. 1 is a block diagram illustrating the prior art circuit calibrating system.
Figure 2:
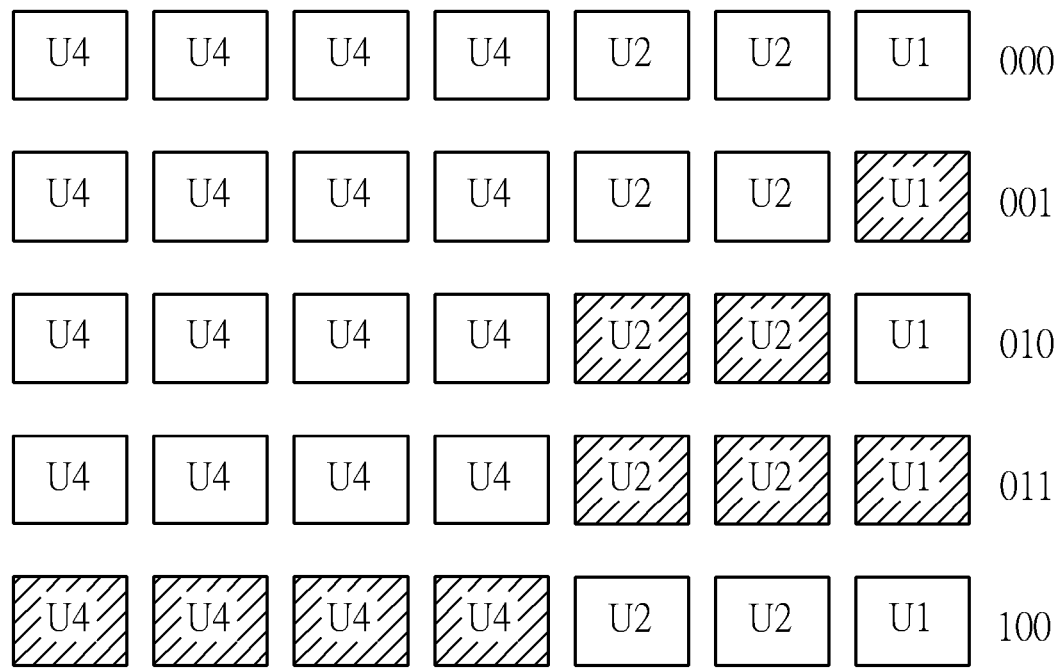
FIG. 2 is a schematic diagram illustrating the ACS generating unit is activated by a digital control code, in prior art.
Figure 6:
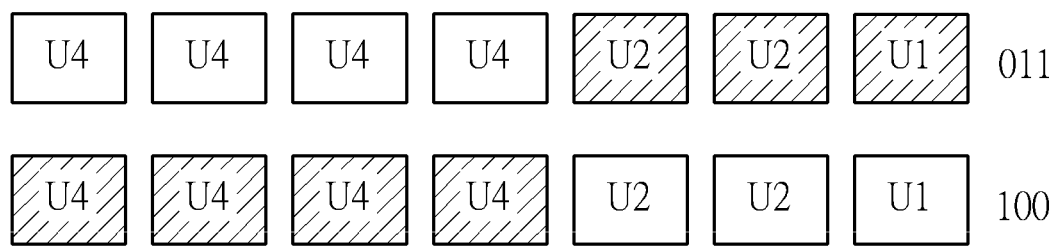
FIG. 6 is a schematic diagram illustrating how to activate the ACS generating circuit via the digital control code, in prior art.

More detail examples are provided in following descriptions to explain the concept of the present application. FIG. 6, which is part of FIG. 2, is a schematic diagram illustrating how to activate the ACS generating circuit via the digital control code, in prior art. As stated in FIG. 6, the ACS generating units U1, U2 are activated if the digital control code is 011, and four ACS generating units are activated if the digital control code is 100. Accordingly, the ACS generating circuit has a larger signal drift if the digital control code 011 is switched to 100, or the digital control code 100 is switched to 011. Accordingly, one embodiment of the present invention adjusts a number of activated ACS generating units, while the digital control code 011 or 100 is applied.

Figure 7:
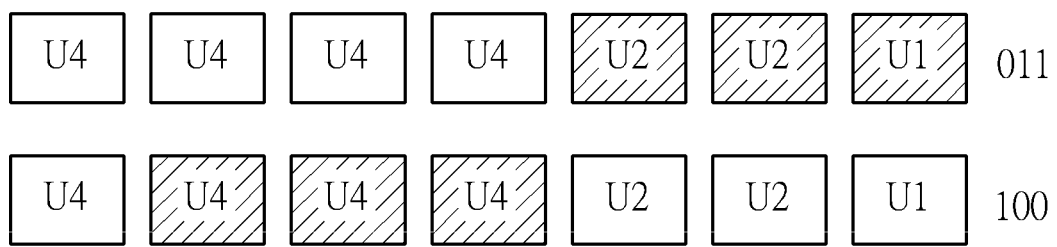
FIG. 7 is a schematic diagram illustrating the circuit calibrating method, according to one embodiment of the present invention.

FIG. 7 is a schematic diagram illustrating the circuit calibrating method, according to one embodiment of the present invention. In this embodiment, the ACS generating units activated by the digital control code 100, which is a MSB (Most Significant Bit) code for a 3 bit digital control code, is adjusted. In the embodiment of FIG. 7, the ACS generating units activated by the digital control code 100 are three CS generating units U4 rather than four CS generating units U4. By this way, the possible signal drift standard deviation may decreases from $\sqrt{7}\delta_{cell}$ to $\sqrt{6}\delta_{cell}$. That is, the signal drift caused by differently activated ACS generating units can be reduced.

Please note the embodiment in FIG. 7 can adjust the ACS generating units activated by the digital control code as well, and is not limited to increase or decrease only one ACS generating unit.

In one embodiment, the adjusting number of the ACS generating units activated by one bit value for a specific stage of digital control code can be applied to other stages of digital control codes. For example, the ACS generating units activated by the digital control code 100 are adjusted from four U4 to three U4, that is, a number of the ACS generating units activated by the bit value corresponding to the third bit of the digital control code 100 is adjusted from four to three. Thereby, the digital control code 111, which is initially supposed to activate one ACS generating unit U1, two ACS generating units U2 and four ACS generating units U4, will be adjusted to activate one ACS generating unit U1, two ACS generating units U2 and three ACS generating units U4, due to the adjustment for the number of ACS generating units activated by the digital control code 100. However, each stage of digital control code can be independent and does not affect each other.

Following examples depict how to determine a number of activated ACS generating units of which digital control code should be adjusted. In one embodiment, it is determined by the following Equation (1):

$$1.5 \times \sqrt{M} \delta_{cell} < S_{err} - 0.5 LSB \quad \text{Equation (1)}$$

M indicates a number for differently activated ACS generating units if a specific stage of digital control code is switched to another stage of digital control code. Take FIG. 6 for example, M=7. $\delta_{cell}$ is a signal drift standard deviation for each ACS generating unit. Also, $S_{err}$ is a threshold error of the system. $\sqrt{M} \delta_{cell}$ indicates a signal drift standard deviation for M differently activated ACS generating units. $3 \times \sqrt{M} \delta_{cell}$ indicates if the product is under mass production, a particular ratio of the products (ex. 99.7%) has a signal drift less than $3 \times \sqrt{M} \delta_{cell}$ (three standard deviations).

LSB is a quantization error for the ACS generating circuit itself, ideally it is zero. Accordingly, based upon above-mentioned Equation (1), M must be smaller than $$\left(\frac{S_{err} - 0.5 LSB}{1.5 \delta_{cell}}\right)^2.$$

For example, if the analog control signal is a current and $S_{err}$ is 0.75 mA and the quantization error for the ACS generating circuit is 1 mA, M must be smaller than $$\left(\frac{0.25}{1.5 \delta_{cell}}\right)^2.$$

If M, which is the number for differently activated ACS generating units if a specific stage of digital control code is switched to another stage of digital control code, at least one for activated ACS generating units for these two digital control codes should be adjusted.

In another embodiment, following equation (2) can be applied to determine a number of activated ACS generating units:

$$1.5 \times \sqrt{M} \delta_{cell} < S_{err} + NLSB - 0.5 LSB \quad \text{Equation (2)}$$

N is a number for activated ACS generating units to be adjusted, thus if M, $\delta_{cell}$, $S_{err}$ and LSB are already known, the number for activated ACS generating units to be adjusted can be acquired.

Figure 8:
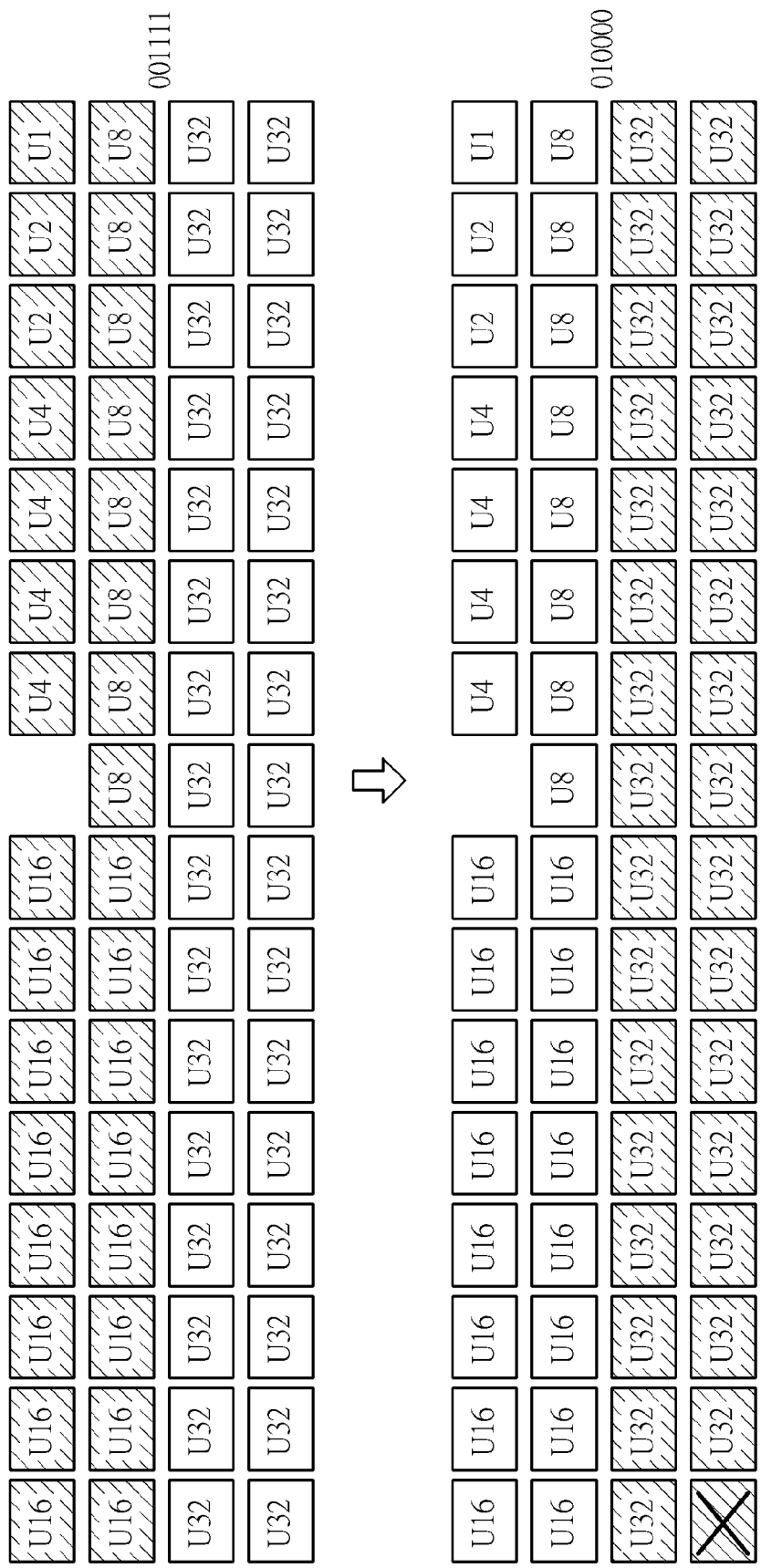
FIG. 8, FIG. 9 and FIG. 10 are schematic diagrams illustrating circuit calibrating methods according to other embodiments of the present invention.
Figure 9:
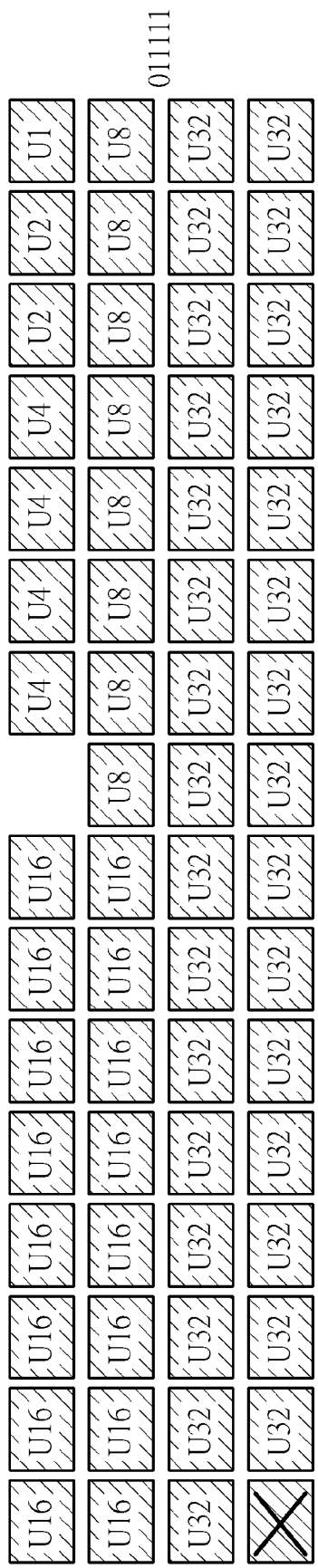
Figure 10:
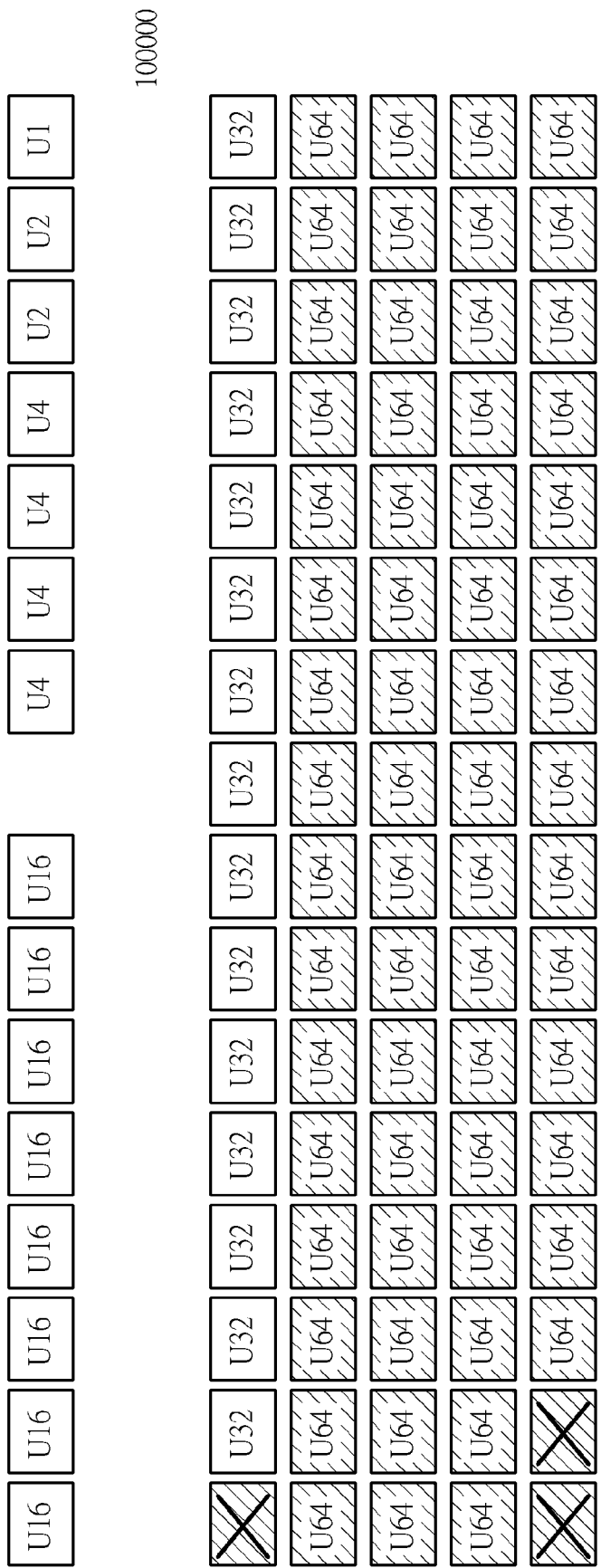

FIG. 8, FIG. 9 and FIG. 10 are schematic diagrams illustrating circuit calibrating methods according to other embodiments of the present invention. In the embodiments of FIG. 8, FIG. 9 and FIG. 10, the digital control code is a 6 bit digital control code. As depicted in FIG. 8, if the digital control code is 001111, one ACS generating unit U1, two ACS generating units U2, four ACS generating units U4, eight ACS generating units U8 and sixteen ACS generating units U16 are activated. Also, if the digital control code is 010000, thirty two ACS generating units are activated. Therefore, if the digital control code is switched from 001111 to 010000, or from 010000 to 001111, the differently activated ACS generating units are sixty three. In view of above-mentioned embodiments, the ACS generating units activated by 001111 or by 010000 can be adjusted, to decrease signal drift. In this example, the ACS generating units activated by 010000 is adjusted from 32 to 31, therefore if the digital control code is switched from 001111 to 010000, or from 010000 to 001111, the differently activated ACS generating units are decreased to sixty two.

As above-mentioned, the ACS generating units activated by the digital control code is not limited to be adjusted for one time, and is not limited to adjust one ACS generating unit. FIG. 9 and FIG. 10 disclose such embodiments. In FIG. 9, the digital control code 011111 initially activate one ACS generating unit U1, two ACS generating units U2, four ACS generating units U4, eight ACS generating units U8, sixteen ACS generating units U16 and thirty two ACS generating units U32. However, since differently activated ACS generating units between the digital control code 011111 and a previous/next stage (i.e. a neighboring stage) of digital control code thereof is large, the ACS generating units activated by the digital control code 011111 is adjusted to one ACS generating unit U1, two ACS generating units U2, four ACS generating units U4, eight ACS generating units U8, sixteen ACS generating units U16 and thirty one ACS generating units U32 (or applying the adjusted number of the embodiment depicted in FIG. 8). Also, if the digital control code is 100000 (i.e. MSB for a 6 bit code), sixteen four ACS generating units U64 are initially activated. Therefore, if the digital control code is switched from 011111 to 100000, one hundred and twenty six differently activated ACS generating units exist. Accordingly, in the embodiment of FIG. 10, the ACS generating units activated by the digital control code 100000 is adjusted from sixty four to sixty two. By this way, if the digital control code is switched from 011111 to 100000, only one hundred and twenty four differently activated ACS generating units exist.

Please note, the scope of the present invention is not limited to above-mentioned embodiments. Accordingly, one circuit calibrating method provided by the present invention can be summarized as: A circuit calibrating method, for calibrating a target circuit, applied to an ACS generating circuit comprising a plurality of ACS generating units, wherein the ACS generating circuit correspondingly activates at least one part of the ACS generating units to generate different analog control signals according to different digital control codes, wherein the circuit calibrating method comprises: (a) determining which one of the analog control signals has a large difference between an actual value of the analog control signal and an ideal value of the analog control signal (for example, in FIG. 6, the analog control signal corresponding to the digital control code 100 has a large difference); (b) adjusting a number of the ACS generating units that a digital control code corresponding to the analog control signal acquired in the step (a) can activate, or adjusting a number of the ACS generating units that a neighboring stage for the digital control code corresponding to the analog control signal acquired in the step (a) can activate; (for example, a number of the ACS generating units activated by the digital control code 011 or 100 is adjusted) and (c) generating the analog control signal to the target circuit, according to the number of the ACS generating units, which is adjusted in the step (b). Please note step (a) can determining which one of the analog control signals has a large difference between an actual value of the analog control signal and an ideal value of the analog control signal based on various standards. For example, based on if the difference is the largest one for all analog control signal, or based on if the difference is larger than a predetermined value.

Further, such embodiment can further comprise: controlling the analog control signal generating units to receive a third digital control code, to activate a third number of the analog control signal generating units among the analog control signal generating units, to generate a third analog control signal to the target circuit; and if a maximum possible signal drift for differently activated analog control signal generating units between the second number of the analog control signal generating units and the third number of the analog control signal generating units is larger than a second threshold error, adjust a number for the analog control signal generating units activated by the third digital control code (ex. embodiments for FIG. 9 and FIG. 10).

Another embodiment further comprises: either the step of adjusting the number of the analog control signal generating units activated by the first digital control code or the step of adjusting the number of the analog control signal generating units activated by the second digital control code adjusts a number of the analog control signal generating units activated by a specific bit of the first digital control code and the second digital control code, wherein the circuit calibrating method further comprises: correspondingly adjusting the number of the analog control signal generating units activated by the specific bit of a third digital control code while the analog control signal generating units receive the third digital control code. For example, in the embodiment of FIG. 7, the third bit of the digital control code 100 is adjusted to activate three ACS generating units, thus the third bit of the digital control code 111 is adjusted to activate three ACS generating units as well.

Figure 11:
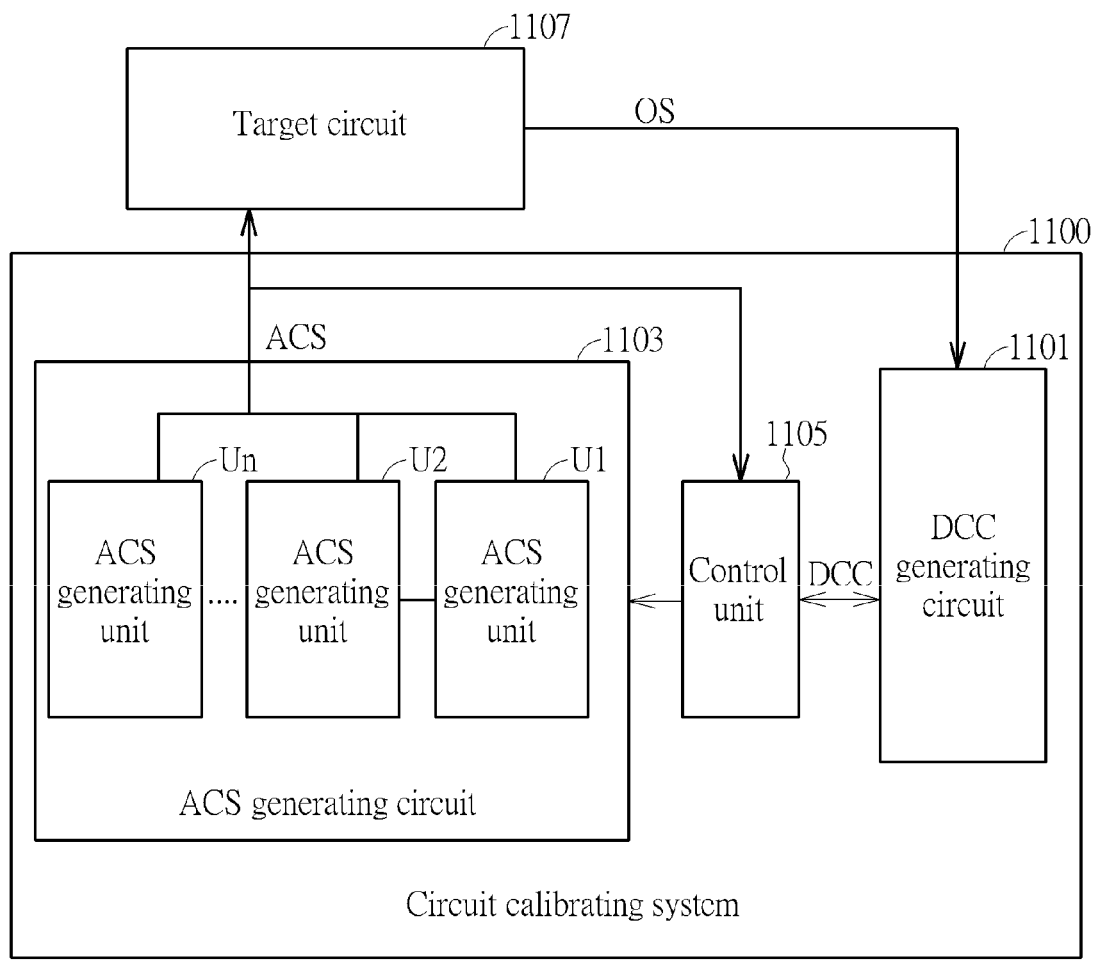
FIG. 11 is a block diagram illustrating a circuit calibrating system according to one embodiment of the present invention.

FIG. 11 is a block diagram illustrating a circuit calibrating system according to one embodiment of the present invention. As stated in FIG. 11, the circuit calibrating system 1100 comprises: a DCC generating circuit 1111, an ACS generating circuit 1103 and a control unit 1105. The DCC generating circuit 1101 is configured to generate a digital control code DCC. The ACS generating circuit 1103 comprises a plurality of ACS generating units U1, U2 . . . Un, configured to correspondingly activate at least one part of the ACS generating units to generate different analog control signals ACS according to different digital control codes DCC. The control unit 1105 is configured to perform following steps (a)-(c): (a) determining which one of the analog control signals ACS has a large difference between an actual value of the analog control signal and an ideal value of the analog control signal; (b) adjusting a number of the ACS generating units that a digital control code DCC corresponding to the analog control signal acquired in the step (a) can activate, or adjusting a number of the ACS generating units that a neighboring stage for the digital control code DCC corresponding to the analog control signal ACS acquired in the step (a) can activate; and (c) generating the analog control signal to the target circuit 1107, according to the number of the ACS generating units, which is adjusted in the step (b).

Other operations for the circuit calibrating system 1100 has been described in other embodiments, thus are omitted for brevity here.

In view of above-mentioned embodiments, the signal drift for the analog control signal can be effectively reduced, to avoid that the signal drift is over a tolerance range. Please note, besides the advantage of decreasing the signal drift, the present invention can further provide an advantage of "increasing the tolerance range for the signal drift. For a circuit calibrating system, if the signal drift is negative, it does not affect the system much, since the positive signal drift in following steps can neutralize the negative signal drift. However, if the signal drift is positive, the system calibrating error may accumulate, such that the system calibrating error may over the tolerance range while switching the digital control codes. Based upon above-mentioned mechanism, a negative signal drift is provided to a switch operation that may have a larger signal drift (i.e. decrease a number for the ACS generating units activated by the digital control code). By this way, the tolerance range for the system error calibrating mechanism can be extended in the positive direction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. circuit calibrating system, applied to calibrate a target circuit, comprising:
   a digital control code generating circuit, configured to generate a digital control code;
   an analog control signal generating circuit, comprising a plurality of analog control signal generating units, configured to correspondingly activate at least one part of the analog control signal generating units to generate different analog control signals according to different digital control codes;
   a control unit, configured to perform following steps (a)-(c):
   (a) determining which one of the analog control signals has a large difference between an actual value of the analog control signal and an ideal value of the analog control signal;
   (b) adjusting a number of the analog control signal generating units that a digital control code corresponding to the analog control signal acquired in the step (a) can activate, or adjusting a number of the analog control signal generating units that a neighboring stage for the digital control code corresponding to the analog control signal acquired in the step (a) can activate; and
   (c) generating the analog control signal to the target circuit, according to the number of the analog control signal generating units, which is adjusted in the step (b).

2. The circuit calibrating system of claim 1, wherein the step(a) comprises:
   (a1) controlling the analog control signal generating units to receive a first digital control code, to activate a first number of the analog control signal generating units among the analog control signal generating units, to generate a first analog control signal to the target circuit; and
   (a2) controlling the analog control signal generating units to receive a second digital control code, to activate a second number of the analog control signal generating units among the analog control signal generating units, to generate a second analog control signal to the target circuit;
   wherein the step (b) comprises:
   (b1) if a maximum possible signal drift for differently activated analog control signal generating units between the first number of the analog control signal generating units and the second number of the analog control signal generating units is larger than a first threshold error, adjust a number for the analog control signal generating units activated by the first digital control code, or adjust a number for the analog control signal generating units activated by the second digital control code.

3. The circuit calibrating system of claim 2, wherein the step(b1) comprises:
determining a first threshold number of the analog control signal generating units according to possible signal drift between the first threshold error and a single analog control signal generating unit; and
if a number of the differently activated analog control signal generating units is larger than the first threshold number, adjust the number for the analog control signal generating units activated by the first digital control code, or adjust the number for the analog control signal generating units activated by the second digital control code.

4. The circuit calibrating system of claim 2, wherein the step(b1) adjusts the number for the analog control signal generating units activated by the second digital control code, wherein the circuit calibrating system further comprises:
controlling the analog control signal generating units to receive a third digital control code, to activate a third number of the analog control signal generating units among the analog control signal generating units, to generate a third analog control signal to the target circuit; and
if a maximum possible signal drift for differently activated analog control signal generating units between the second number of the analog control signal generating units and the third number of the analog control signal generating units is larger than a second threshold error, adjust a number for the analog control signal generating units activated by the third digital control code.

5. The circuit calibrating system of claim 2, wherein the first number equals to a binary value of the first digital control code, wherein the second number equals to a binary value of the second digital control code.

6. The circuit calibrating system of claim 2, wherein the second control code is a MSB (Most Significant Bit) digital control code, wherein the step (b1) adjusts the number of the analog control signal generating units activated by the second digital control code.

7. The circuit calibrating system of claim 2, wherein either the step of adjusting the number of the analog control signal generating units activated by the first digital control code or the step of adjusting the number of the analog control signal generating units activated by the second digital control code adjusts a number of the analog control signal generating units activated by a specific bit of the first digital control code and the second digital control code, wherein the circuit calibrating system further comprises:
correspondingly adjusting the number of the analog control signal generating units activated by the specific bit of a third digital control code while the analog control signal generating units receive the third digital control code.

* * * * *